US005953608A

United States Patent [19]
Hirota

[11] Patent Number: 5,953,608
[45] Date of Patent: *Sep. 14, 1999

[54] METHOD OF FORMING A DRAM STACKED CAPACITOR USING AN ETCH BLOCKING FILM OF SILICON OXIDE

[75] Inventor: Toshiyuki Hirota, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/888,827

[22] Filed: Jul. 7, 1997

[30] Foreign Application Priority Data

Jul. 4, 1996 [JP] Japan ................................. 8-174950

[51] Int. Cl.$^6$ ................................. H01L 1/8242
[52] U.S. Cl. ................................. 438/253; 438/254
[58] Field of Search ................................. 438/253–255, 438/396–398

[56] References Cited

U.S. PATENT DOCUMENTS

| | | | |
|---|---|---|---|
| 5,164,337 | 11/1992 | Ogawa et al. | 437/228 |
| 5,447,878 | 9/1995 | Park et al. | 438/253 |
| 5,550,077 | 8/1996 | Tseng et al. | 437/52 |
| 5,659,351 | 8/1997 | Wu | 438/253 |

FOREIGN PATENT DOCUMENTS

| | | |
|---|---|---|
| 53-135263 | 11/1978 | Japan . |
| 1-270344 | 10/1989 | Japan . |
| 3-232271 | 10/1991 | Japan . |
| 5-67730 | 3/1993 | Japan . |
| 6-21382 | 1/1994 | Japan . |
| 6-29463 | 2/1994 | Japan . |
| 6-196649 | 7/1994 | Japan . |
| 2290908 | 1/1996 | United Kingdom . |

OTHER PUBLICATIONS

T. Ema et al., "3–Dimensional Stacked Capacitor Cell for 16M and 64M DRAMs", *IEDM 88, 1998*, pp. 592–595.

*Primary Examiner*—Jey Tsai
*Attorney, Agent, or Firm*—Sughrue, Mion, Zinn, Macpeak & Seas, PLLC

[57] ABSTRACT

A method of forming a stacked capacitor of a dynamic random access memory is disclose. The stacked capacitor is provided on a transistor and comprises first and second electrodes and a dielectric film sandwiched therebetween. The first electrode serving as a storage node. A first silicon oxide film is deposited on an interlayer dielectric film provided on the transistor. The first silicon oxide film is provided for preventing etching of the interlayer dielectric film. Subsequently, an amorphous silicon film is deposited on the first silicon oxide film. The silicon film is used to form the storage node and has density lower than density of the first silicon oxide film. Following this, a second silicon oxide is deposited on the silicon film. The second silicon oxide film is used to shape said silicon film. The second silicon oxide film is selectively removed after the silicon film is shaped using the second silicon oxide.

14 Claims, 7 Drawing Sheets

METHOD OF FORMING A DRAM STACKED CAPACITOR USING AN ETCH BLOCKING FILM OF SILICON OXIDE

BACKGROUND OF THE INVENTION

1. Field of the Invention

The present invention relates generally to a method of forming a stacked capacitor of a dynamic random access memory (DRAM) cell, and more specifically to a method of forming a storage node (viz., charge storage electrode) of a stacked capacitor using an etch blocking film of silicon oxide.

2. Description of the Related Art

As is known in the art, it is a current practice to use a one-transistor dynamic memory cell because it is able to meet the demand for ever increasing packaging density. The one-transistor DRAM cell consists of one select (access) transistor and one storage capacitor. The select transistor has a gate that is controlled by a word line. When the word line is selected, the select transistor turns on and the charge stored on the capacitor is fed out onto a bit line and to a sense amplifier.

With increasing integration of semiconductor devices, a three-dimensional structure of capacitor cell for increasing the effective charge storage area has been proposed to ensure reliable operations of the DRAM. Generally, there are two types of three-dimensional capacitor structures, one of which is a stacked capacitor and the other is a trenched capacitor. However, It is a recent trend to prefer the stacked capacitor rather than the trenched one in that the stacked capacitor is less susceptible to a soft error problem due to alpha radiation emitted from the packaging material (for example).

By way of example, a cylinder type stacked capacitor is disclosed in Japanese Laid-open Patent Application Nos. 3-232271 and 6-29463. Further, another approach to increasing the capacitance is a fin type stacked capacitor that is disclosed in Japanese Laid-open Patent Application No. 1-270344. Still further, a multi-fin type stacked capacitor is disclosed in a paper entitled "3-dimensional stacked capacitor cell for 16M and 64M DRAMs), 593–595 pages, 1988 International Electron Devices Meeting. The present invention is applicable to all the above mentioned types.

Before turning to the present invention it is deemed preferable to briefly describe, with reference to FIGS. 1(A) and 1(B), a DRAM cell having a conventional cylinder type stacked capacitor.

As shown in FIG. 1(A), a field oxide 10 is selectively formed on a silicon substrate 12 using a conventional cell segregation technique such as an LOCOS (local oxidation of silicon) method. It is readily understood that if an n-channel select transistor is to be fabricated, the substrate 12 should be p-type, while if a p-channel select transistor is to be formed, the substrate 12 should be n-type.

A select transistor of a DRAM cell is well known in the art and thus, a brief description thereof will be given for the sake of simplifying the disclosure. After forming the field oxide 10, source/drain regions 14 and 16 are provided on the substrate 12, after which a gate electrode 18 is formed via a gate oxide layer (no numeral) on the substrate 12. These regions 14, 16 and 18 constitute the select transistor.

A word line 20 is formed on the field oxide 10 in a direction perpendicular to the drawing sheet. Although not shown in FIG. 1, the word line 20 is connected to the gate electrode 18. Subsequently, an interlayer dielectric film (silicon oxide) 22 is deposited in a manner to cover the gate electrode 18 and the word line 20. More specifically, the interlayer dielectric film 22 consists of two layers formed using a CVD (chemical vapor deposition) process, one of which is an HTO (high temperature oxide) layer and the other is a BPSG (boro-phospho-silicate glass) layer deposited on the former one. The dielectric film 22 is then subjected to annealing at a temperature between 750 and 900° C. so as to improve flatness by reflow.

Following this, a contact hole 24 is formed or cut on the source/drain region 14 and is filled with an electrically conductive material such as tungusten, titanium nitride, tungsten silicide, etc. Thus, a bit line contact plug 26 is formed. Thereafter, the top surface of the insulator layer 22 is patterned, using a photolithography technique, so as to form a bit line 28 (denoted by dashed lines). Another interlayer dielectric film 30 is then deposited on the interlayer dielectric film 22 in a manner to cover the bit line 26, after which the dielectric film 30 is flattened using a chemical mechanical polishing (CMP) technique.

A silicon nitride film 32, which functions as an etch blocking film (or stopper), is formed on the dielectric film 30 by way of a photolithography process. Thereafter, a contact hole 34 is formed on the source/drain region 16. Although not clearly shown in FIG. 1(A), an amorphous silicon film including phosphorous with density of $1.5 \times 10^{20}$ atoms/cm$^2$ is deposited on the top surface of the silicon nitride film where the contact hole 34 is open. This film deposition is done using a LPCVD (low pressure chemical deposition) method using gases of $PH_3$ and $SiH_4$ (or $Si_2H_6$).

Subsequent series of process steps involve the formation of a lower charge storage electrode (viz., storage node) 35, a sidewall 36, and an electrode shaping film 37. These steps are not described in detail at this stage for the sake of simplifying the disclosure but will be made clearer as the description proceed to FIGS. 2(C)–2(H). Following this, the substrate 10 is immersed in a hydrofluoric acid solution in order to remove, by etching, the electrode shaping film 37, as shown in FIG. 1(B). A reference numeral 38 indicates a storage node (viz., lower charge storage electrode) of a DRAM cell, which consists of the electrode 35 and the sidewall 36.

In the above, the silicon nitride film 32 is an etch blocking (stopping) film which is used to remove the electrode shaping film 37. That is, the silicon nitride film 32 is provided to protect the interlayer dielectric film 30 from being etched. However, it is not seldom that a comparatively large stress of the silicon nitride film 32 causes cracks in the layer 32 itself and the interlayer dielectric film 30. Further, the silicon nitride film 32 tends to exhibit charge-up (accumulation of charges) due to a high electrical trap density thereof which is inherent in silicon nitride. In addition, the silicon nitride film 32 has characteristics of preventing a hydrogen gas to pass therethrough, which causes a problem of insufficient annealing by the hydrogen gas. The above mentioned difficulties lead to the lowering of memory cell operation reliability as well as yield reduction of DRAMs.

SUMMARY OF THE INVENTION

It is therefore an object of the present to provide a method of fabricating a memory cell wherein a silicon oxide film is used in place of a silicon nitride film in order to overcome the problems inherent in the prior art.

One aspect of the present invention resides in a method of forming a stacked capacitor of a dynamic random access memory, the stacked capacitor being provided on a transistor and comprising first and second electrodes and a dielectric film sandwiched therebetween, the first electrode serving as a storage node, the method comprising the steps of: depositing a first silicon oxide film on an interlayer dielectric film provided on the transistor, the first silicon oxide film being provided for preventing etching of the interlayer dielectric film; depositing a silicon film on the first silicon oxide film, the silicon film being used to form the storage node and having density lower than density of the first silicon oxide film; depositing a second silicon oxide on the silicon film, the second silicon oxide film being used to shape the silicon film; and selectively removing the second silicon oxide film after shaping the silicon film using the second silicon oxide.

Another aspect of the present invention resides in a method of forming a stacked capacitor of a dynamic random access memory, the stacked capacitor being provided on a transistor and comprising first and second electrodes and a dielectric film sandwiched therebetween, the first electrode serving as a storage node, the method comprising the steps of: depositing a first silicon oxide film on an interlayer dielectric film provided on the transistor, the first silicon oxide film being provided for preventing etching of the interlayer dielectric film; depositing a second silicon oxide on the first silicon oxide; depositing a silicon film on the second silicon oxide film, the silicon film being used to form the storage node, having density lower than density of the first silicon oxide film, and being shaped using the second silicon oxide film; and selectively removing the second silicon oxide film after shaping the silicon film using the second silicon oxide.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 1A:
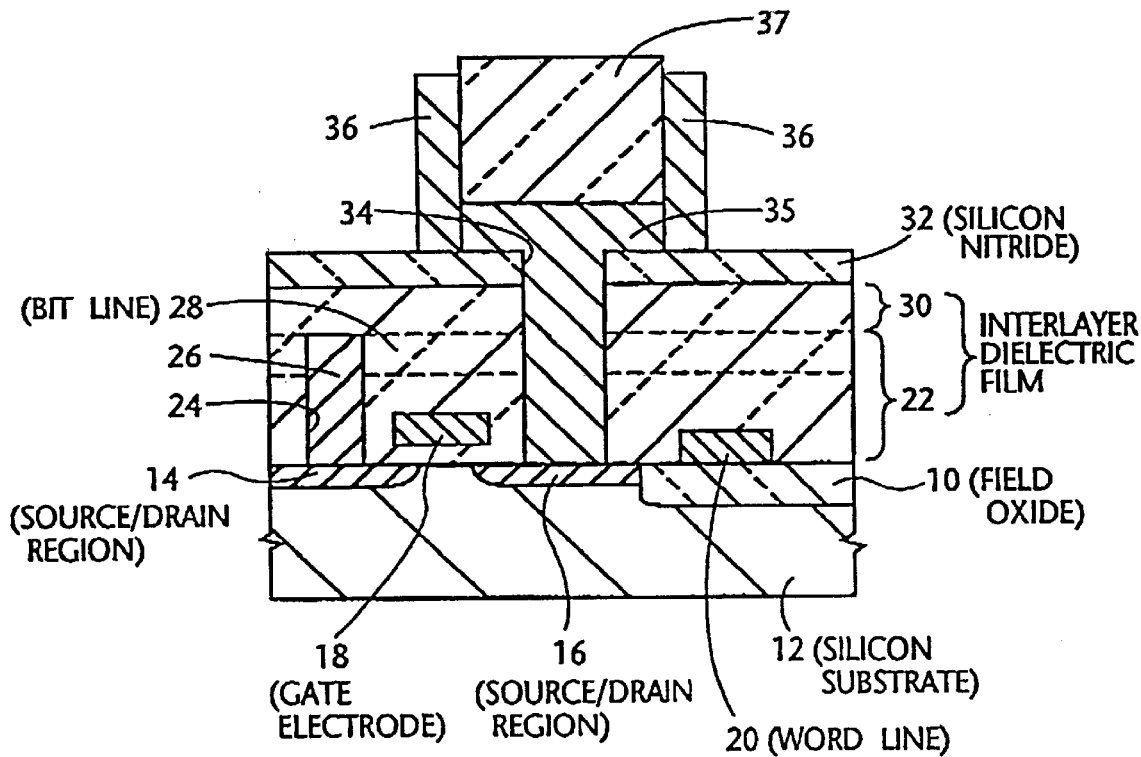
FIGS. 1(A) and 1(B) are a cross-sectional representation of a conventional DRAM fabricating method, described in the opening paragraphs of the instant disclosure.
Figure 1B:
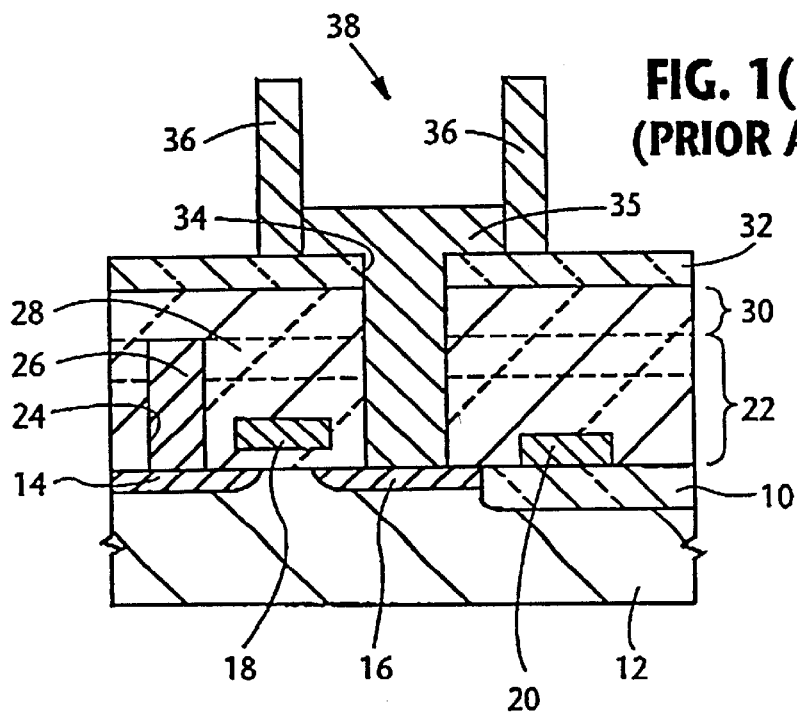

An embodiment of the present invention will be described with reference to FIGS. 2(A)–2(J), which illustrate a series of processes for fabricating a DRAM having a cylinder type stacked capacitor according to the present invention. In order to simplify the disclosure, the processes already described in connection with FIGS. 1(A) and 1(B) may be omitted except when it becomes necessary in the context of description.

Figure 2A:
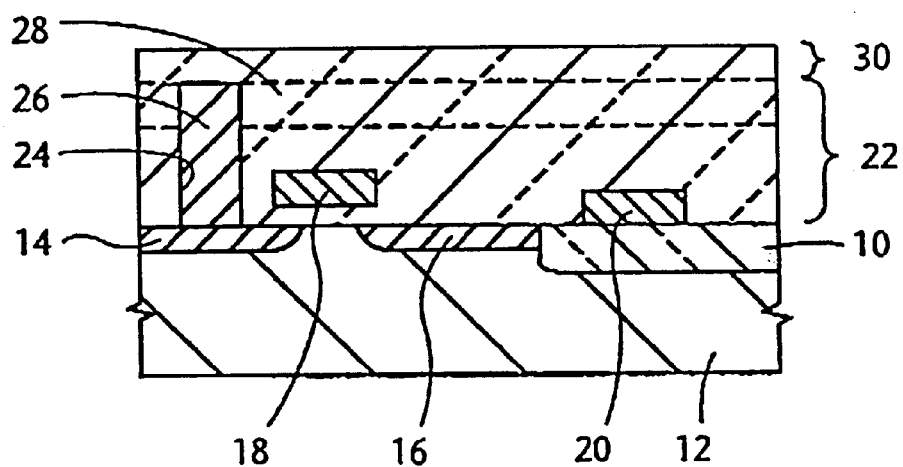
FIGS. 2(A)–2(J) are a schematic cross-sectional representation of a method of fabricating a DRAM having a cylinder type stacked capacitor according to the present invention.

FIG. 2(A) shows a sectional view of a select transistor section, viz., up to the formation of the interlayer dielectric layer (silicon oxide) 30 of FIG. 1, which has been described with reference to FIG. 1 and thus the description thereof will be omitted for brevity.

Figure 2B:
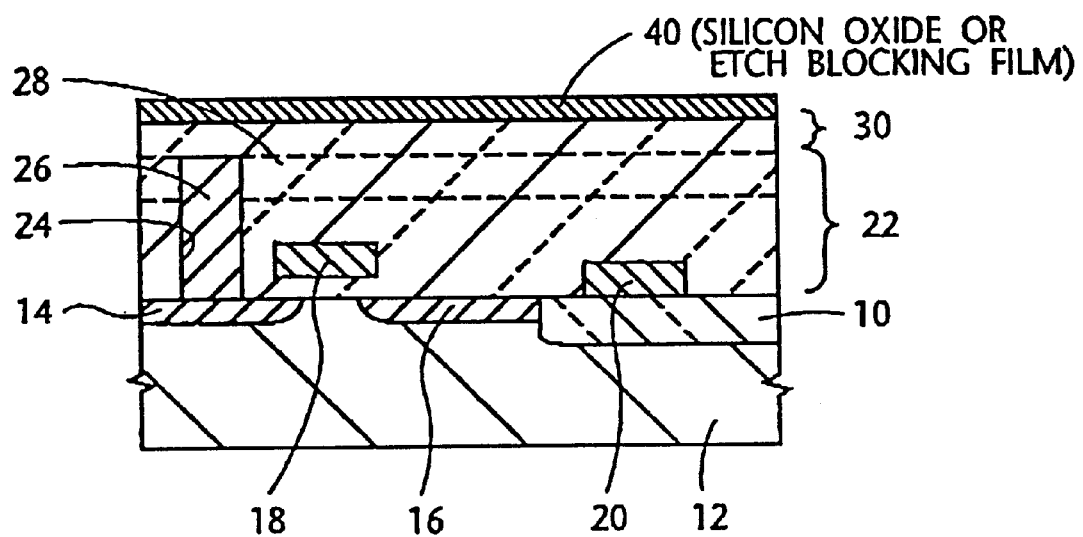

After fattening the top surface of the interlayer dielectric film 30 using the CMP process as in the prior art, a silicon oxide 40 is deposited on the dielectric layer 30 as shown in FIG. 2(B). The silicon oxide 40 functions as an etch blocking film and is directly relevant to the present invention and thus, may be interchangeably referred to as an etch blocking film.

The process for forming the silicon oxide (viz., etch blocking film) 40 involves an initial step at which a non-doped silicate glass (NSG) film is deposited on the dielectric film 30 up to a thickness of about 100 nm. This is done using a CVD method; reactive gasses of $SiH_4$ and $O_2$ and temperature between 400 and 500° C. Subsequently, the NSG film thus deposited undergoes a baking at 700 to 950° C. so as to markedly increase the density of the NSG film. The etch blocking film (viz., NSG film) 40 after the baking has the density of about 2.20–2.26 $g/cm^3$. The etch rate of the etch blocking film 40 is on the order of 10 nm/min in 0.5 wt % hydrofluoric acid solution at about 25° C. In general, when the density of the etch blocking film 40 exceeds about 2.20 $g/cm^3$, the etch rate thereof in the hydrofluoric acid solution is greatly reduced.

As an alternative, the silicon oxide 40 can be formed by another method. That is, a non-doped silicate glass (NSG) film is deposited using a CVD method; reactive gasses of $SiH_4$ and $N_2O$ and temperature between 750–850° C. In this case, there is no need for annealing the deposited NSG film (viz., silicon oxide 40).

Figure 2C:
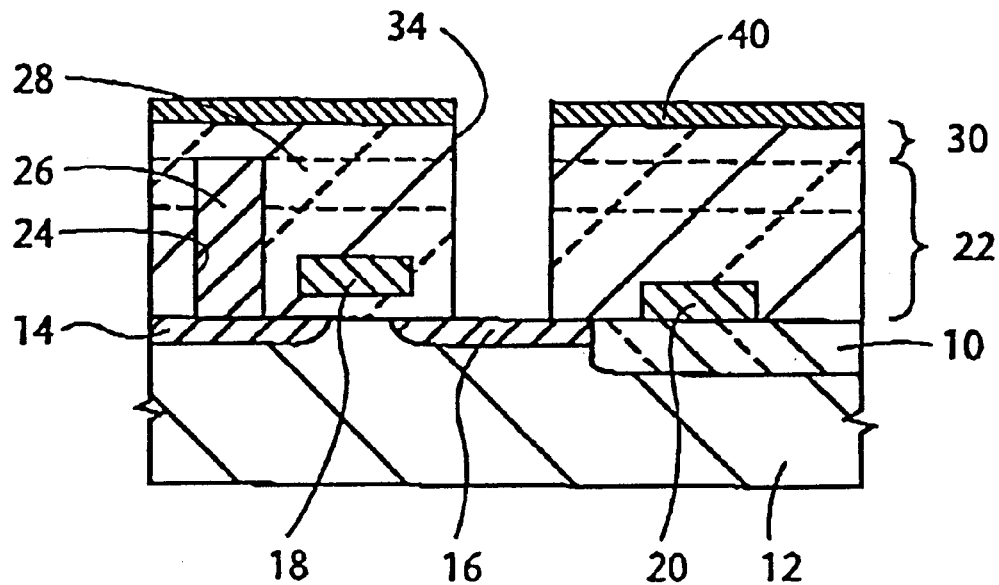
Figure 2D:
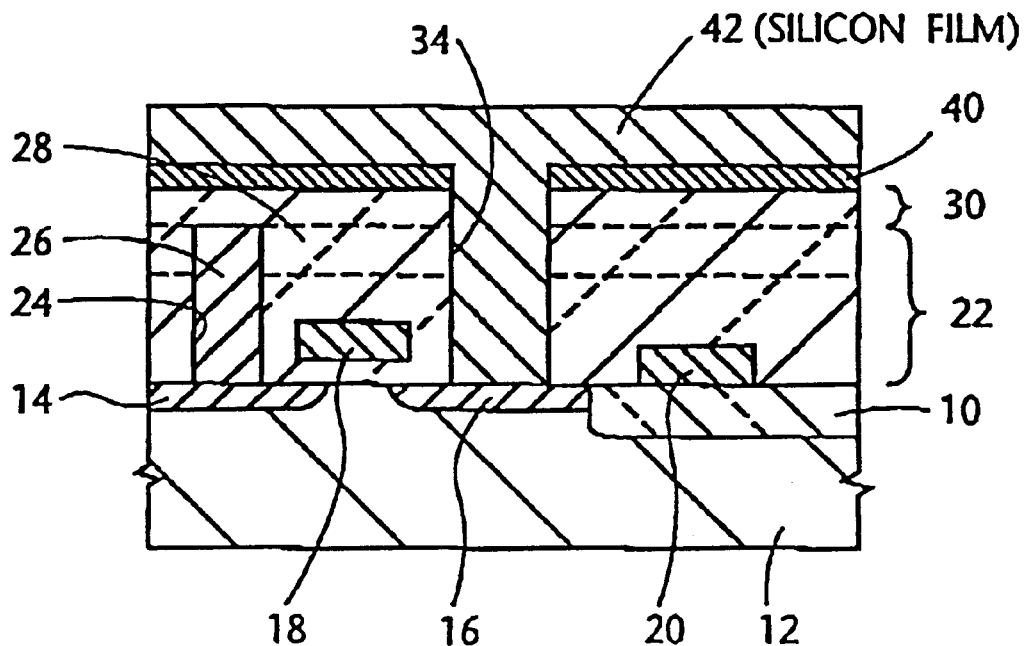

Reference is made to FIG. 2(C) wherein, as in the conventional method, the contact hole 34 is formed on the source/drain region 16. Thereafter, as shown in FIG. 2(D), an amorphous silicon film 42, including phosphorous with density of $1.5 \times 10^{20}$ $atoms/cm^2$, is deposited on the top surface of the structure shown in FIG. 2(C) in a manner to fill the contact hole 34. This deposition is implemented using a LPCVD method, gases of $PH_3$ and $SiH_4$ (or $Si_2H_6$). The thickness of the amorphous silicon film 42 on the silicon oxide 40 is between 100 and 300 nm. The amorphous silicon film 42 is shaped so as to become a lower electrode (denoted by 42') of the storage node as is best shown in FIG. 2(I).

Figure 2E:
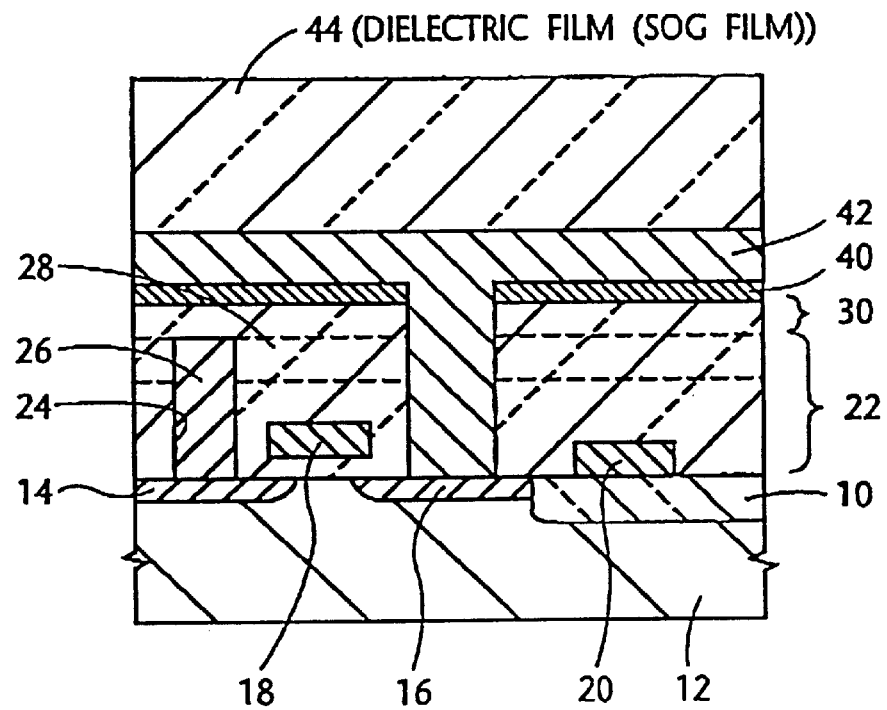

Referring to FIG. 2(E), a dielectric film (silicon oxide) 44 is now deposited on the top surface of the amorphous silicon film 42 using a conventional sol-gel method. That is, the dielectric film 44 is formed as follows by way of example. First, a condensation product of alkoxysilane, such as tetrametoxysilane, tetraethoxysilane, methyltrialkoxysilane, or methyltriethoxysilan, is dissolved in an organic solvent of alcohol-, ketone-, or ester-group. Thereafter, water is added to the condensation product so as to hydrolyze the product in the presence of a catalyzer such as HCl or $H_2SO_4$. The resultant liquid is then applied to the top surface of the amorphous silicon film 42 using a spinner, after which the wafer is given a baking (typically at 350 to 400° C.). Thus, a silicon-on-glass (SOG) film (viz., dielectric film 44) develops on the film 42. The SOG film (viz., dielectric film 44) thus obtained has a thickness of about 500 nm and exhibits a density of as low as 1.75 to 2.15 $g/cm^2$. The SOG film 44 retains a large amount of OH-groups, and is porous and thus exhibits high hygroscopicity. Further, the SOG film 44 may contain an alkyl group.

The dielectric film 44 is etched at a rate of 1000–1500 nm/min in 0.5 wt % hydrofluoric acid solution at 25° C. It is understood that the etch rate of the dielectric film 44 is approximately 100 times that of the etch blocking film 40. However, if the etch rate of the dielectric film 44 is too high, this dielectric film 44 is undesirably etched during the subsequent steps such as wafer cleaning and photoresist removal with the result of defects of the dielectric film 44. It is therefore preferable to set the etch rate of the dielectric film 44 to about 1000 nm/min under the above mentioned etching conditions (viz., 0.5 wt % hydrofluoric acid and at 25° C.). By way of example, the etch rate of the dielectric film 44 can be adjusted by controlling the density of the film 44. This density is controlled by the mixture ratio of the contents of the liquid for use in forming the SOG film 44 and also by changing the baking temperature immediately following the spinning step. The dielectric film 44 is used to shape the storage node of the memory cell. It is to be noted that the density of the SOG film 44 should not exceed 2.15 g/cm$^3$.

As an alternative, the dielectric film 44 can be prepared using a method other than the aforesaid sol-gel method. That is, the dielectric film 44 is formed using a parallel-plate, plasma-assisted CVD reactor under the conditions of; process gases $SiH_4$ and $N_2O$; pressure of 2 Torr, a substrate temperature between 200 and 300° C.; and a voltage of radio-frequency 13.56 MHz. The dielectric film 44 thus formed contains a large amount of hydrogen to an extent that silicon is terminated by hydrogen and thus, an Si—O network is broken. More specifically, the incorporation of hydrogen into the film 44 results in loose coupling of the Si—O network itself. According to the experiment conducted by the inventor, the film 44 with density of about 2.01 g/cm$^3$ was obtained. The density of the film 44 can be raised using two different electric discharge frequencies of 13.56 MHz and 300 kHz while increasing the power of the lower frequency (viz., 300 kHz) Further, the density of the film 44 can also be increased by raising the substrate temperature. On the contrary, the density of the film 44 can be lowered by adding a hydrogen gas or by lowering the substrate temperature. In any way, the dielectric film 44 is preferably be formed which has a density between 1.75 and 2.15 g/cm$^3$.

Still further, the dielectric film 44 with a relatively low density can be formed using another CVD process wherein an organic gas, containing hydrogen-combined silicon (such as $SiH(OC_2H_5)$, is used as a process gas. The dielectric film thus deposited contains a large number of Si—H combinations and thus, a dielectric film with a density between 1.75 and 2.15 g/cm$^3$ can be obtained.

Figure 2F:
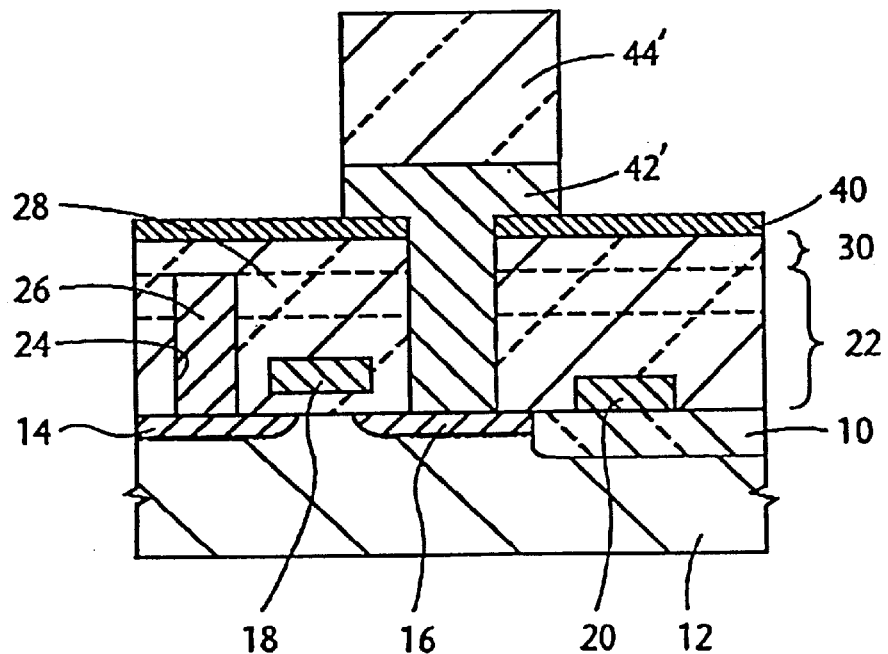

The silicon film 42 and the dielectric film 44 are then shaped as shown in FIG. 2(F) using conventional photolithography and dry etching techniques. In FIG. 2(F), the silicon film 42 and the dielectric film 44, both shaped, are respectively denoted by 42' and 44' for a better understanding of the disclosure.

Figure 2G:
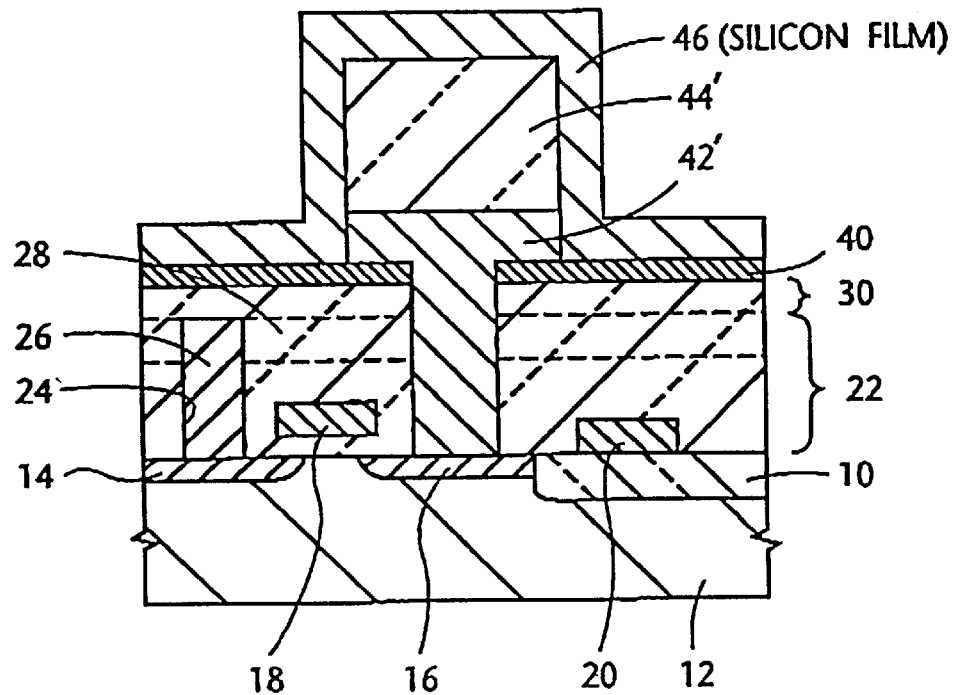

Subsequently, as shown in FIG. 2(G), a silicon film 46 is deposited, using the same process as used to form the silicon film 42, so as to cover the top surface of the structure of FIG. 2(F). The thickness of the layer 46 is about 100 nm.

Figure 2H:
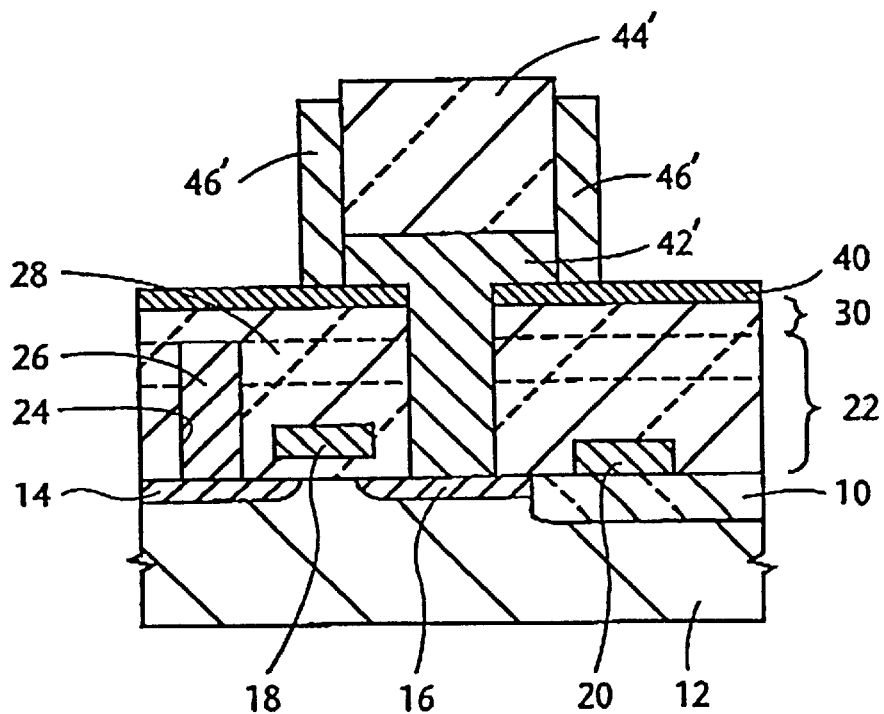
Figure 2I:
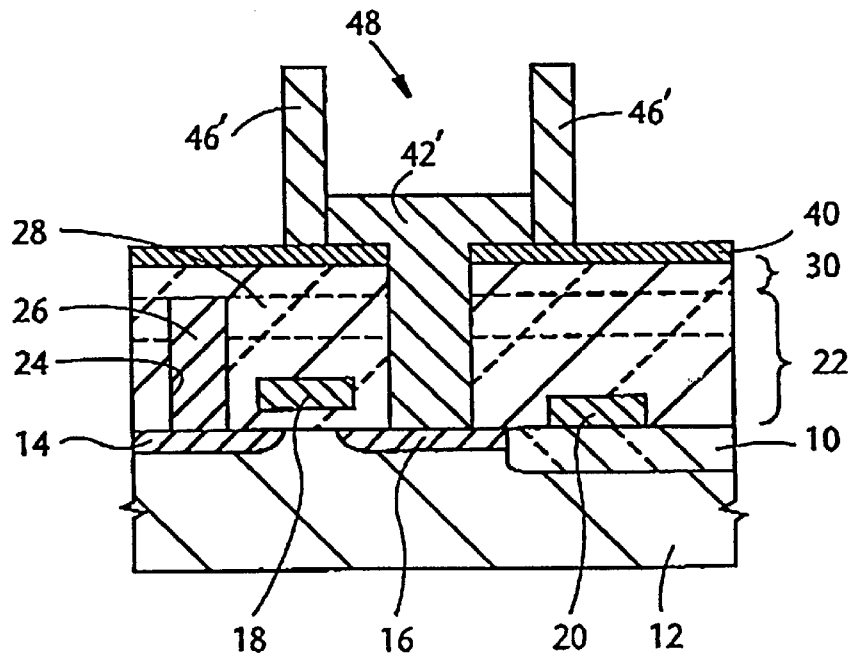

Referring to FIG. 2(H), the silicon film 46 is then anisotropically etched to form a sidewall 46' at the side surface of the silicon oxide 44' and the silicon film 42'. It is to be noted that the portion of the silicon film 46, which has been shaped to from the sidewall, is represented by 46' for the sake of convenience of description. The above etching exposes the top portion of the dielectric layer 44'. Reactive gases, used with the anisotropic etching, are a mixture of $Cl_2$, $O_2$ and HBr.

The silicon substrate is then immersed in 0.5 wt % hydrofluoric acid solution at 250° C. for one minute so as to remove the dielectric layer 44'. As mentioned above, the selectivity of the dielectric film 44' to the etch blocking film 40 is about 100 and thus, the film 40 is able to protect the interlayer dielectric film 30 from being undesirably etched. Thus, a storage node (or charge storage electrode) 48, consisting of the silicon film 42' and the sidewall 46', is shaped as shown in FIG. 2(I).

Figure 2J:
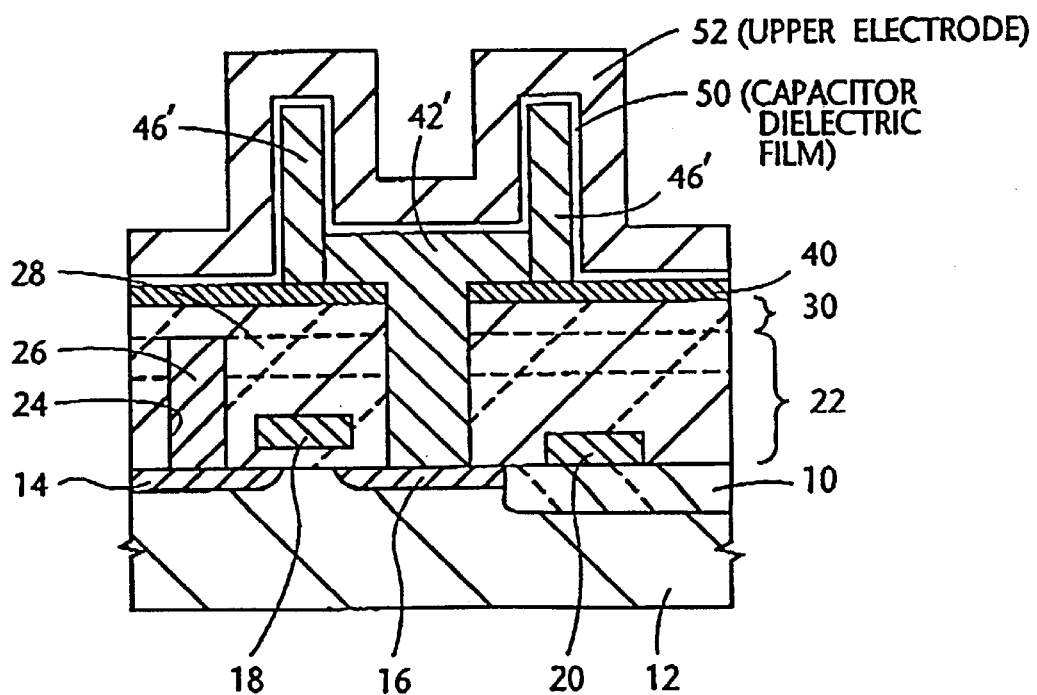

After forming the storage node 48, native (or natural) oxide existing on the storage node 48 is removed using a dilute hydrofluoric acid solution. In order to prevent the regeneration of native oxide, the silicon substrate is subjected to rapid nitriding in an atmosphere of ammonia gas at about 900° C. A silicon nitride film of 5 nm thickness is deposited on the entire top surface of the structure of FIG. 2(I) using a conventional LPCVD process, after which the silicon nitride film is thermally oxidized in an atmosphere of 800° C. water vapor. Thus, as shown in FIG. 2(J), a capacitor dielectric film 50 having a structure of $SiO_2/Si_3N_4$ is formed. Subsequently, a polysilicon film 52 having a thickness of 150 nm, which serves as an opposite (or upper) capacitor electrode, is then deposited in a manner to cover the capacitor dielectric film 50 as shown in FIG. 2(J). Subsequently, a phosphorous impurity is doped into the upper capacitor electrode 52 using a conventional thermal diffusion technique at about 800° C. During this process, the lower electrode (storage node) 48 is polycrystallized. Thus, a DRAM having a cylinder type stacked capacitor is fabricated.

In the above discussion, the etch blocking film 40 is deposited on the interlayer dielectric layer 30, after which the contact hole 34 is formed or cut and then the silicon film 42 is deposited. As an alternative, the contact hole 34 may be formed after depositing the dielectric film (viz., electrode shaping film) 44 on the etch blocking film 40. Thereafter, the silicon film 42, which becomes part of the lower electrode, is deposited on the film 44. A second dielectric film, corresponding to the film 44, is then further deposited on the silicon oxide 42 as shown in FIG. 2(E). Subsequently, the electrode shaping layer 44 is chemically removed thereby to form a gap between the upper surface of the etch blocking film and the part of lower surface of the storage node (viz., the film 42). Following steps of this case are exactly identical to those shown in FIGS. 2(F)–2(J). This alternative indicates that more effective area for storing charges can be obtained. The above processes and structure are more clearly understood when referring to FIG. 4.

Figure 3:
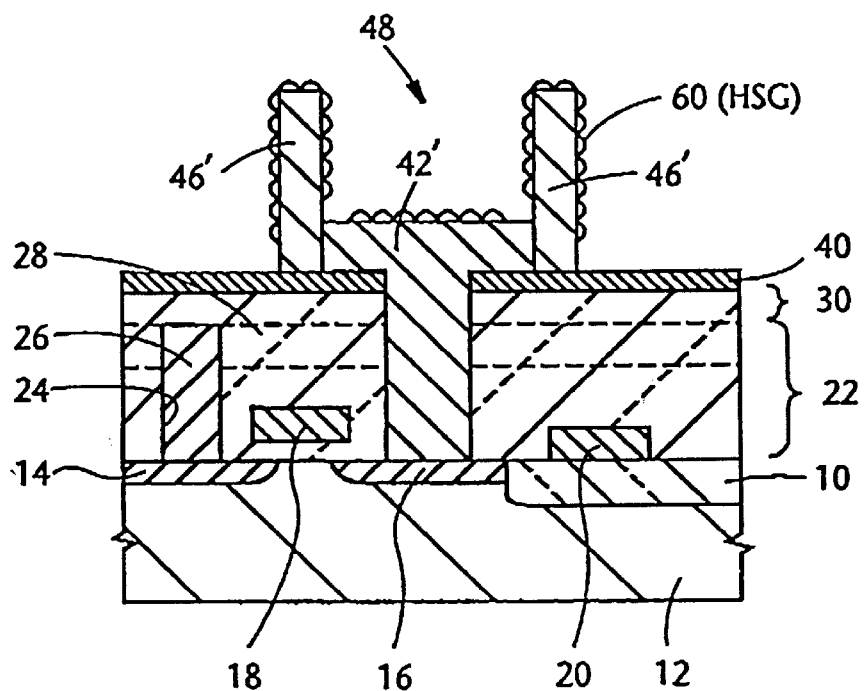
FIG. 3 is a schematic cross-sectional view of hemisphere-silicon grains grown on a storage node of FIG. 2(I)

FIG. 3 is a sectional view of a plurality of hemisphere-silicon-grains (HSGs) grown on the storage node 48. The present invention is advantageously applicable to such a case as mentioned below. The HSGs 60 are useful for increasing the charge storage area. The deposition of the HSGs 60 itself is known in the art (for example, Japanese Laid-open Patent No. 5-67730) and hence a brief description thereof is given. After the native oxide on the storage node 48 is removed, silicon crystalline nucleuses are selectively generated on the storage node (amorphous silicon films) 48 using a gas of $SiH_4$ (or $Si_2H_6$) at a temperature between 550 and 660° C. and at pressure of 0.1 to 1.0 mTorr. This process is implemented under the condition that the partial pressure of each of oxygen and water is less than 10$^{-8}$ Torr. Following this, when the storage node 48 is annealed at the same temperature as mentioned above, the HSGs are grown from silicon crystalline nucleuses. With the prior art wherein the silicon nitride layer 32 is used, the silicon atoms undesirably accumulate on the layer 32 because the incubation time of each silicon crystal on the layer 32 is comparatively short. As a result, the HSGs protrude into the capacitor dielectric film thereby reducing insulation effect between the upper and lower electrodes. However, according to the present invention, the incubation time of each silicon crystal of the silicon oxide (viz., etch blocking film) 40 is relatively large and thus, such a problem can be overcome.

Figure 4:
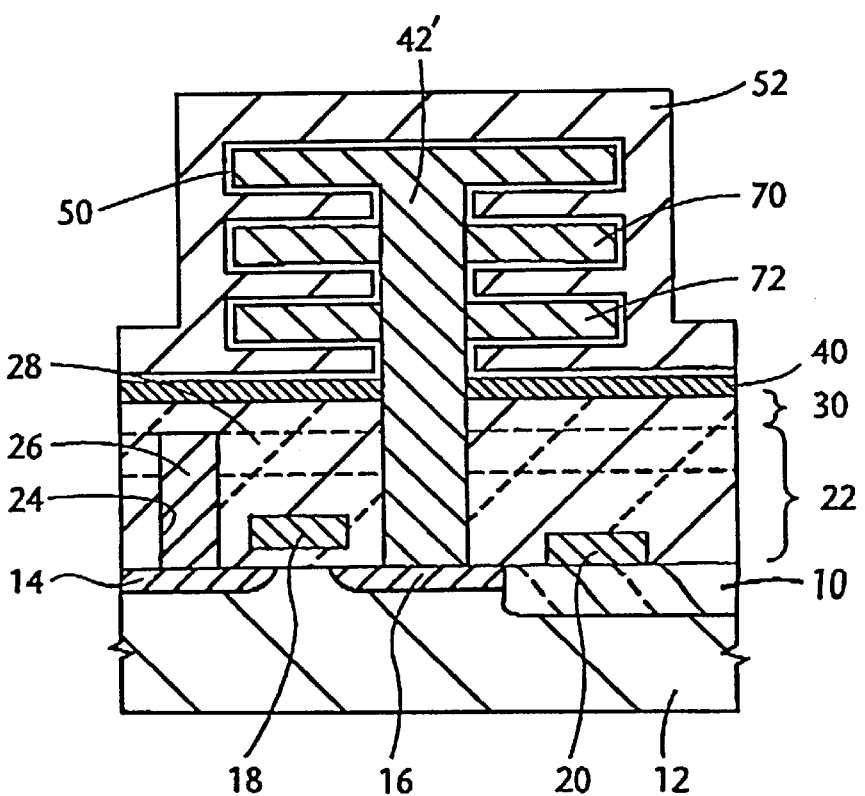
FIG. 4 is a schematic cross-sectional view of a DRAM having a multi-fin type stacked capacitor to which the present invention is applicable.

FIG. 4 is a sectional view of a DRAM having a multi-fin type stacked capacitor to which the present invention is applicable. As shown, two fin electrodes 70 and 72, each of which serves as a charge storage electrode, are provided in addition to the above mentioned storage electrode 42'. Such a type capacitor is well known in the art as referred to in the opening paragraphs of the instant disclosure in order to increase the effective charge storage area and thus, further description thereof is omitted for simplifying the instant disclosure.

It will be understood that the above disclosure is representative of the preferred embodiments of the present invention and that the concept on which the invention is based is not specifically limited thereto.

What is claimed is:

1. A method of forming a stacked capacitor of a dynamic random access memory, said stacked capacitor being provided on a transistor and comprising first and second electrodes and a dielectric film sandwiched therebetween, said first electrode serving as a storage node, said method comprising the steps of:

forming a first silicon oxide film on an interlayer dielectric film provided on said transistor, said first silicon oxide film being provided for preventing etching of said interlayer dielectric film;

forming a silicon film on said first silicon oxide film, said silicon film being used to form said storage node and having density lower than density of said first silicon oxide film;

forming a second silicon oxide on said silicon film, said second silicon oxide film being used to shape said the silicon film; and selectively removing said second silicon oxide film after shaping said silicon film using said second silicon oxide.

2. A method as claimed in claim 1, wherein said storage node is a cylinder configuration.

3. A method as claimed in claim 1, wherein the density of said first silicon oxide film exceeds 2.20 g/cm$^3$.

4. A method as claimed in claim 1, wherein said first silicon oxide film is formed using a thermal chemical vapor deposition process and is annealed at a temperature over 700° C.

5. A method as claimed in claim 1, wherein said second silicon oxide film has a density of 1.75 to 2.15 g/cm$^3$.

6. A method as claimed in claim 1, wherein after said silicon film is shaped, said second silicon oxide film is selectively etched in a hydrofluoric acid solution using said first silicon oxide film as an etch blocking means.

7. A method as claimed in claim 1, wherein an etch selectivity of said second silicon oxide film to said first silicon oxide film is greater than 100.

8. A method of forming a stacked capacitor of a dynamic random access memory, said stacked capacitor being provided on a transistor and comprising first and second electrodes and a dielectric film sandwiched therebetween, said first electrode serving as a storage node, said method comprising the steps of:

forming a first silicon oxide film on an interlayer dielectric film provided on said transistor, said first silicon oxide film being provided for preventing etching of said interlayer dielectric film;

forming a second silicon oxide on said first silicon oxide;

forming a silicon film on said second silicon oxide film, said silicon film being used to form said storage node, having density lower than density of said first silicon oxide film, and being shaped using said second silicon oxide film; and selectively removing said second silicon oxide film after shaping said silicon film using said second silicon oxide.

9. A method as claimed in claim 8, wherein said storage node is a fin configuration.

10. A method as claimed in claim 8, wherein the density of said first silicon oxide film exceeds 2.20 g/cm$^3$.

11. A method as claimed in claim 8, wherein said first silicon oxide film is formed using a thermal chemical vapor deposition process and is annealed at a temperature over 700° C.

12. A method as claimed in claim 8, wherein said second silicon oxide film has a density of 1.75 to 2.15 g/cm$^3$.

13. A method as claimed in claim 8, wherein after said silicon film is shaped, said second silicon oxide film is selectively etched in a hydrofluoric acid solution using said first silicon oxide film as an etch blocking means.

14. A method as claimed in claim 8, wherein an etch selectivity of said second silicon oxide film to said first silicon oxide film is greater than 100.

* * * * *

UNITED STATES PATENT AND TRADEMARK OFFICE
CERTIFICATE OF CORRECTION

PATENT NO. : 5,953,608
DATED : September 14, 1999
INVENTOR(S) : Toshiyuki HIROTA It is certified that error appears in the above-identified patent and that said Letters Patent is hereby corrected as shown below:

Column 2, line 12, delete "tungusten" and insert --tungsten--.

Column 5, line 40, delete "$(OC_2H_5)$" and insert --$(OC_2H_5)_4$--.

Signed and Sealed this

Twentieth Day of June, 2000

Attest:

Q. TODD DICKINSON

*Attesting Officer*     *Director of Patents and Trademarks*